(12) United States Patent
Wei et al.

(10) Patent No.: US 9,523,870 B2
(45) Date of Patent: Dec. 20, 2016

(54) VERTICAL PN SILICON MODULATOR

(71) Applicant: Futurewei Technologies, Inc., Plano, TX (US)

(72) Inventors: Hongzhen Wei, Pleasanton, CA (US); Li Yang, San Jose, CA (US); Qianfan Xu, Denver, CO (US); Xiao Shen, San Bruno, CA (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 14/680,823

(22) Filed: Apr. 7, 2015

(65) Prior Publication Data

US 2016/0299363 A1  Oct. 13, 2016

(51) Int. Cl.
| | |
|---|---|
| *G02F 1/035* | (2006.01) |
| *G02F 1/025* | (2006.01) |
| *H01L 21/225* | (2006.01) |
| *H01L 21/3215* | (2006.01) |
| *H01L 21/306* | (2006.01) |
| *G02F 1/015* | (2006.01) |

(52) U.S. Cl.
CPC ............ *G02F 1/025* (2013.01); *H01L 21/2253* (2013.01); *H01L 21/30604* (2013.01); *H01L 21/3215* (2013.01); *G02F 2001/0151* (2013.01)

(58) Field of Classification Search
CPC ................................................ G02F 2001/0151
See application file for complete search history.

(56) References Cited

U.S. PATENT DOCUMENTS

| | | | | |
|---|---|---|---|---|
| 6,845,198 B2* | 1/2005 | Montgomery | ........ | G02F 1/2257 359/245 |
| 8,363,986 B2* | 1/2013 | Webster | ................. | G02B 26/00 385/1 |
| 8,450,186 B2* | 5/2013 | Rong | ...................... | G02F 1/025 257/532 |

(Continued)

FOREIGN PATENT DOCUMENTS

WO  2010039594 A2  4/2010

OTHER PUBLICATIONS

Liu, et al., "Recent Development in a High-Speed Silicon Optical Modulator Based on Reverse-Biased PN Diode in a Silicon Waveguide," Semiconductor Science and Technology, Semicond. Sci. Technol. 23, IOP Publishing Ltd., 2008, 7 pages.

(Continued)

*Primary Examiner* — Rhonda Peace
(74) *Attorney, Agent, or Firm* — Conley Rose, P.C.

(57) ABSTRACT

A silicon waveguide comprising a waveguide core that comprises a first positively doped (P1) region vertically adjacent to a second positively doped (P2) region. The P2 region is more heavily positively doped than the P1 region. A first negatively doped (N1) region is vertically adjacent to a second negatively doped (N2) region. The N2 region is more heavily negatively doped than the N1 region. The N2 region and the P2 region are positioned vertically adjacent to form a positive-negative (PN) junction. The N1 region, the N2 region, the P1 region, and the P2 region are positioned as a vertical PN junction and configured to completely deplete the P2 region of positive ions and completely deplete the N2 region of negative ions when a voltage drop is applied across the N1 region, the N2 region, the P1 region, and the P2 region.

25 Claims, 12 Drawing Sheets

(56) References Cited

U.S. PATENT DOCUMENTS

| | | | |
|---|---|---|---|
| 9,036,953 B2* | 5/2015 | Witzens | G02F 1/0121 385/142 |
| 2009/0290831 A1 | 11/2009 | Green et al. | |
| 2010/0060970 A1 | 3/2010 | Chen | |
| 2010/0080504 A1* | 4/2010 | Shetrit | G02B 6/12004 385/14 |
| 2014/0248019 A1* | 9/2014 | Witzens | G02F 1/0121 385/2 |
| 2015/0212346 A1* | 7/2015 | Zheng | G02F 1/025 398/186 |

OTHER PUBLICATIONS

Tu, et al., "Fabrication of Low Loss and High Speed Silicon Optical Modulator Using Doping Compensation Method," Optics Express 18029, vol. 19, No. 19, Sep. 12, 2011, 7 pages.

Foreign Communication From a Counterpart Application, PCT Application No. PCT/CN2016/076630, International Search Report dated Jun. 16, 2016, 8 pages.

Foreign Communication From a Counterpart Application, PCT Application No. PCT/CN2016/076630, Written Opinion dated Jun. 16, 2016, 5 pages.

\* cited by examiner

VERTICAL PN SILICON MODULATOR

STATEMENT REGARDING FEDERALLY SPONSORED RESEARCH OR DEVELOPMENT

Not applicable.

REFERENCE TO A MICROFICHE APPENDIX

Not applicable.

BACKGROUND

Silicon photonic devices are components that employ silicon as an optical medium for transmission of light waves in an optical and/or electro-optical system. Silicon modulators are employed to selectively alter the phase of such light waves to create optical signals. For example, by selectively creating a voltage drop across a waveguide, a refractive index of the waveguide can be selectively altered. Selective alteration of the refractive index can be employed to change the phase of the light (e.g. increase and/or decrease the speed of the carrier wave) to modulate a signal onto the wave. Silicon modulators are associated with multiple design constraints. For example, doping may be employed to create the modulator. Heavy doping may result in decreased electrical resistance across the modulator, which may in turn result in greater modulation efficiency. For example, heavy doping may allow a modulator to be power efficient, switch states quickly, and be implemented in a small area. Heavy doping may also result in optical loss resulting in lower power (e.g. dimmer) optical signals, thereby reducing the ability of the modulator to create a usable optical signal. Particular doping schemes are used to achieve particular results in light of these constraints.

SUMMARY

In one embodiment, the disclosure includes an optical modulator comprising a silicon waveguide comprising a waveguide core that comprises a first positively doped (P1) region vertically adjacent to a second positively doped (P2) region such that the P2 region is more heavily positively doped than the P1 region, and a first negatively doped (N1) region vertically adjacent to a second negatively doped (N2) region such that the N2 region is more heavily negatively doped than the N1 region, wherein the N2 region and the P2 region are positioned vertically adjacent to form a positive-negative (PN) junction, at least one cathode, and at least one anode selectively electrically coupled to the cathode across the waveguide core via the PN junction such that a voltage drop applied between the cathode and the anode modulates an optical carrier passing through the PN junction by changing a refractive index of the waveguide core, wherein the P2 region is smaller than the P1 region and the N2 region is smaller than the P2 region such that the P2 and N2 regions have a greater effect on refractive index change than the P1 and N1 regions and such that the P1 and N1 regions have a lesser effect on optical loss of the optical carrier than the P2 and N2 regions.

In another embodiment, the disclosure includes a silicon waveguide comprising a waveguide core that comprises a P1 region vertically adjacent to a P2 region such that the P2 region is more heavily positively doped than the P1 region, and a N1 region vertically adjacent to a N2 region such that the N2 region is more heavily negatively doped than the N1 region, wherein the N2 region and the P2 region are positioned vertically adjacent to form a PN junction, wherein the N1 region, the N2 region, the P1 region, and the P2 region are positioned as a vertical PN junction and configured to completely deplete the P2 region of positive ions and completely deplete the N2 region of negative ions when a voltage drop is applied across the N1 region, the N2 region, the P1 region, and the P2 region.

In another embodiment, the disclosure includes an optical modulator prepared by a process comprising surface doping a N1 region of a silicon wafer to create a vertically adjacent N2 region such that the N2 region is more heavily negatively doped than the N1 region, and growing, via in-situ doped growth, a P1 region and a vertically adjacent P2 region on the N2 region such that the P2 region is more heavily positively doped than the P1 region and such that the P2 region and the N2 region form a depletion region of a vertical PN junction.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
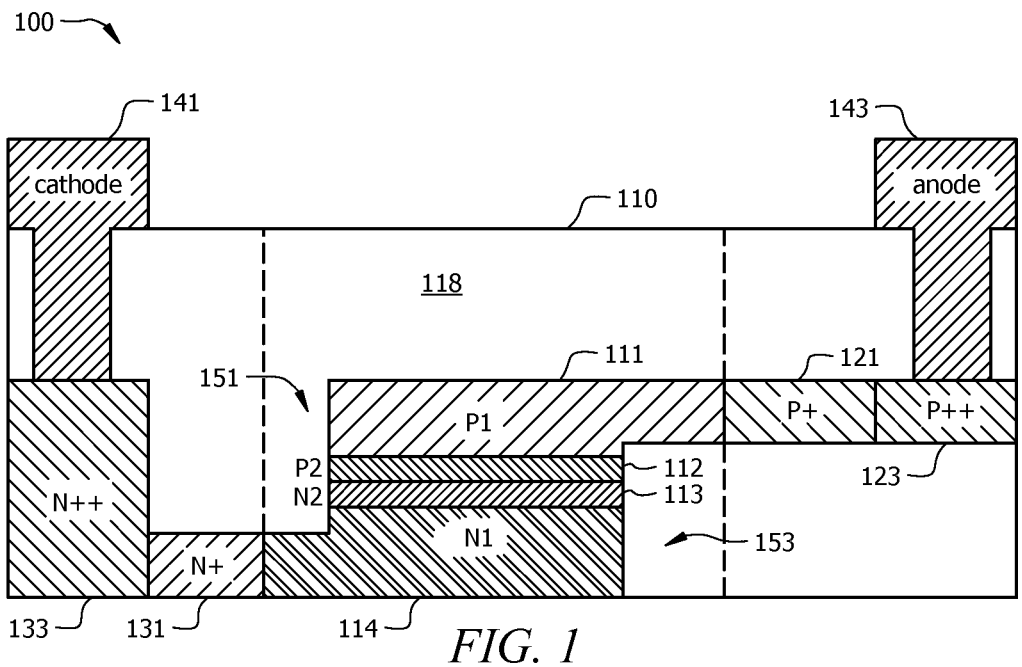
FIG. 1 is a schematic diagram of an embodiment of an optical modulator with a vertical PN junction.

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Silicon modulators may be created by positively (P) doping some portions of a waveguide core, while negatively (N) doping other portions. The junction of a P area and an N area is referred to as a PN junction. A depletion mode PN modulator operates by depleting electrical charge at the PN junction to change the refractive index of the optical mode of the waveguide. The optical mode is the portion of the waveguide that carries a particular light wave. By depleting the charge, for example by applying a voltage, the refractive index increases and the carrier density decreases resulting in a slower lightwave through the optical mode. When the voltage is removed, the refractive index decreases and the carrier density increases, allowing the light to move faster through the optical mode. Heavy P and N doping allows a charge depletion to occur quickly and reduces electrical resistance, but results in optical loss.

Modulation of an optical signal passing through a silicon modulator is performed based on the free carrier plasma effect. When applied to a PN junction, a depletion width (w) based on the free carrier plasma effect can be described by:

$$w = \sqrt{\frac{2\varepsilon}{q} \frac{N_A + N_D}{N_A N_D} (V + \phi_B)}$$

where w is the depletion width (or height), $\in$ is a dielectric constant of the waveguide 110, q is the electron charge, V is an applied voltage, $\phi_B$ is a built-in potential associated with a waveguide, and $N_D$ and $N_A$ are electron donor and acceptor concentrations. The depletion width and refractive index change based on changes to the applied voltage. When the depletion region is overlapped the optical waveguide mode, also referred to herein as a waveguide core, the mode index is modulated. The depletion region is the area in which all free ions are depleted when voltage is applied to a PN junction. More overlap between the depletion region and the optical mode results in higher modulation efficiency. For an exemplary silicon waveguide, when the waveguide width is larger than the height for transverse electric (TE) mode, the mode width is larger than the mode height. For example, for a silicon waveguide with width of 450 nanometers (nm) and height of 220 nm, the TE mode width is about 1.9 micrometers (μm) while the mode height is only about 0.5 μm. For a PN junction, depending on the doping level and applied reverse voltage, the depletion width is from several tens of nanometers to 100 to 200 nms. For a lateral PN junction modulator, the overlap between the depletion and the waveguide mode is much smaller. While when the PN junction is in the vertical direction, the overlap between the depletion region and the optical mode is much larger resulting in a higher modulation efficiency for vertical PN modulators than for lateral PN modulators.

Disclosed herein is a vertical PN junction that employs small areas of heavy P and N doping at the center of a waveguide core with larger areas of lighter P and N doping for the remainder of the waveguide core. The heavy P and N doping at the center of the optical mode have a positive effect on modulation efficiency, but do no contribute significantly to optical loss because of the small area. The larger area of light P and N doping allow for a large/wide PN junction with low resistance and high modulation efficiency (e.g. small power requirements, fast state switching, and short junction length requirements), while retaining a lower optical loss because of the light doping in the larger lightly doped P and N areas. The vertical PN junction may be considered vertical because the heavily doped P portion is placed above (or below) the heavily doped N portion during a multi-layered manufacturing process. The heavily doped portions may be created by in-situ growth and/or surface doping, which can generate an abrupt PN doping profile to create a small highly doped PN junction during a multistage manufacturing process.

FIG. 1 is a schematic diagram of an embodiment of an optical modulator 100 with a vertical PN junction. FIG. 1 illustrates a cross-sectional view of the optical modulator 100, such that an optical carrier passes transversely through the profile of the optical modulator 100 (e.g. passing through the optical modulator 100 from above to below the page, or vice versa). FIG. 1 employs shading to clearly delineate between regions of the optical modulator 100 as discussed more fully herein. Optical modulator 100 comprises a waveguide 110 with a vertical PN junction comprising positively doped regions P1 111 and P2 112, and negatively doped regions N2 113 and N1 114. P1 111, P2 112, N2 113, and N1 114 are positioned in a waveguide core 118 of the waveguide 110. The optical modulator 100 further comprises a cathode 141 electrically coupled to the vertical PN junction by heavily negatively doped region (N++) 133 and heavily negatively doped region (N+) 131. The optical modulator 100 further comprises an anode 143 electrically coupled to the vertical PN junction by heavily positively doped region (P++) 123 and heavily positively doped region (P+) 121. Waveguide core edges 151 and 153 remain substantially undoped.

Waveguide 110 may comprise any semi-conducting material that may be doped by introducing impurities to modulate electrical properties of the material. In an embodiment, the waveguide comprises silicon (Si), silicon dioxide ($SiO_2$), Aluminum (Al), combinations thereof, and/or materials with similar electrical and/or chemical properties. The waveguide core 118 is a portion of the waveguide selected to conduct an optical carrier, such as a laser light. The portion of the waveguide core 118 that transports the optical carrier may be referred to as the optical mode of the waveguide 110. The waveguide core 118 is transparent to the optical carrier selected (e.g. infrared light) in order to allow the optical carrier to propagate through the waveguide core 118. The waveguide core 118 comprises the vertical PN junction. The PN junction is positioned such that when a voltage drop is applied across the PN junction, qualities of the waveguide core 118 related to optical carrier transparency, such as a refractive index, are altered. By altering the properties of the waveguide core 118 the PN junction may employ electrical voltage to speed or slow light passing through the waveguide core 118 in order to modulate a signal into the optical carrier. It should be noted that while the waveguide core 118 is illustrated as bounded by dashed lines for purposes of illustration, light from the optical carrier diffuses from the center of the waveguide core 118 outward, resulting in an inexact waveguide core 118 boundary that may change based on the optical carrier.

The PN junction positioned in the waveguide core 118 comprises an abrupt profile with a small heavily doped center comprising P2 112 and N2 113 and lightly doped edges comprising P1 111 and N1 114. As such, P2 112 and N2 113 are more heavily doped than P1 111 and N1 114, respectively. P2 112 and N2 113 are selected to have a height approximately equal to an expected depletion region (e.g. depletion width/height as discussed above) based on an expected applied voltage. Specifically, P2 112 and N2 113 are selected to have a height such that when a voltage is applied to the PN junction, P2 112 is substantially/completely depleted of positive ions and N2 113 is substantially/completely depleted of negative ions. For example, P2 112 and N2 113 may have a combined height of 20-50 nm. The heavy doping of P2 112 and N2 113 (e.g. the depletion region) have an outsized effect on modulation efficiency. Meanwhile, P1 111 and N1 114 are positioned vertically adjacent to P2 112 and N2 113, respectively, and substantially outside of the depletion region. As P1 111 and N1 114 are positioned outside of the depletion region, their doping may be lower than the doping for P2 112 and N2 113. Further, doping of the overall PN junction has a negative effect on optical loss. By concentrating doping in the depletion region of the waveguide core 118 and reducing doping outside of the depletion region of the waveguide core 118, modulation efficiency is increased while limiting optical loss associated with the doping.

Anode 143 and cathode 141 are implanted into the optical modulator 100 to electrically couple via the PN junction and selectively provide the applied voltage to the PN junction in order to modulate the optical carrier. Anode 143 and cathode 141 are electrically coupled to the PN junction via P++ 123 and N++ 133, respectively, which are each heavily doped to provide connection points and create a low resistance coupling for electron flow. P++ 123 and N++ 133 are positioned away from the waveguide core 118 to mitigate and/or prevent the heavy doping of P++ 123 and N++ 133 from altering the optical loss of the waveguide core 118.

P++ 123 and N++ 133 couple to the PN junction via P+ 121 and N+ 131, respectively. P+ 121 and N+ 131 are sized and doped to provide a low resistance electrical coupling between P++ 123 and N++ 133, respectively, and the PN junction. As P+ 121 and N+ 131 couple to the edge of the waveguide core 118, P+ 121 and N+ 131 may have some peripheral effect on optical loss. Accordingly, P+ 121 and N+ 131 are less heavily doped than P++ 123 and N++ 133, respectively. However, P+ 121 and N+ 131 are employed to conduct current to the PN junction. Accordingly, P+ 121 and N+ 131 are more heavily doped than P1 111 and N1 114, respectively, to promote lower electrical resistance resulting in greater modulation efficiency.

The waveguide 110 comprises edges 151 and 153, which remain substantially undoped. Specifically, edges 151 and 153 may comprise $SiO_2$, and may act as a dielectric. The configuration of optical modulator 100 results in edges 151 and 153 being unneeded for electrical coupling.

It should be noted that waveguide 110 is not symmetrical. As such, waveguide 110 may be seen as a lower slab comprising N++ 133, N+ 131, N2 113, and N1 114 and an upper slab comprising P1 111, P2 112, P+ 121, and P++ 123. The creation of the upper slab and lower slab allows for the creation of edges 151 and 153. An example process for the creation of non-symmetrical waveguide 110 is discussed more fully in reference to FIG. 12 hereinbelow. Further, it should be noted that the positive and negative doping of all regions may be swapped resulting in a change in polarity without a change in function of the optical modulator 100.

Multiple methods may be employed to create the abrupt PN junction. In a first embodiment, a top silicon layer is thinned to about half by thermal oxidation. A low doped negative area (e.g. N1 114) is implanted, and then high surface doping is employed to form a thin and high doped negative layer (e.g. N2 113). In-situ doped growth is then employed to create a thin high doped positive layer (e.g. P2 112) and a low doped positive layer (e.g. P1 111). In another embodiment, a top silicon layer is thinned down to a specified height (e.g. about 80 nm) by thermal oxidation. Low doping is then employed to create a negative area (e.g. N1 114). Then in-situ growth is employed to create the high doped layers (e.g. N2 113 and P2 112) and a low doped positive layer (e.g. P1 111). Both embodiments generate the abrupt PN junction. Considering the high temperature thermal budget during the silicon growth, the dopant may experience some diffusing.

Figure 2:
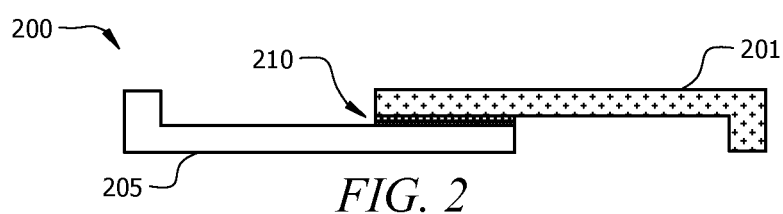
FIG. 2 is a schematic diagram of an embodiment of an optical modulator without a voltage drop.

FIG. 2 is a schematic diagram of an embodiment of an optical modulator 200 without a voltage drop. FIG. 2 illustrates a cross-sectional view of the optical modulator 200, such that an optical carrier passes transversely through the profile of the optical modulator 200. Optical modulator 200 may comprise substantially the same configuration as optical modulator 100, and may be a specific embodiment of optical modulator 100 as shown without an applied voltage drop. Optical modulator 200 comprises an upper slab 201 that corresponds to P1 111, P+ 121, and P++ 123, a lower slab 205 that corresponds to N++ 133, N+ 131, and N1 114, and a PN junction 210 that corresponds to P2 112 and N2 113. Optical modulator 200 comprises a waveguide thickness of 215 nm, an upper slab 201 thickness of 90 nm, a lower slab 205 thickness of 90 nm, and a waveguide width of 500 nm. The doping level used in optical modulator 200 is N1=$2e^{17}$/centimeter (cm)$^3$; P1=$2e^{17}$/cm$^3$; N2=$2e^{18}$/cm$^3$; P2=$2e^{18}$/cm$^3$; n+=$8e^{18}$/cm$^3$; and P+=$8e^{18}$/cm$^3$. N+ and P+ are 0.8 µm away from the waveguide core. Thickness of P2 and N2 are 30 nm and the junction width is 20 nm. Upper slab 201 is illustrated with stippling and lower slab 205 is illustrated without stippling to indicate positive electron acceptor and negative electron donor regions, respectively. Optical modulator 200 comprises a PN junction 210 without depletion as no voltage drop is employed to cause electron depletion. Accordingly, stippling and lack of stippling is substantially homogenous across the upper slab 201 and lower slab 205, respectively.

Figure 3:
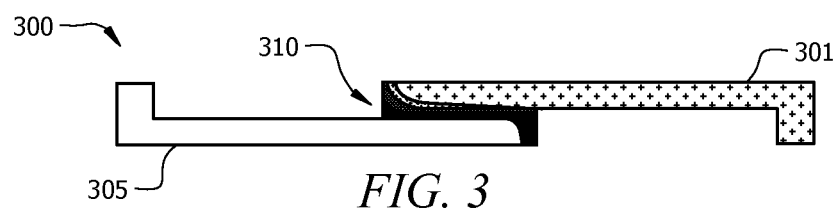
FIG. 3 is a schematic diagram of an embodiment of an optical modulator with a voltage drop.

FIG. 3 is a schematic diagram of an embodiment of an optical modulator 300 with a voltage drop, for example with a −2 volt (V) bias. FIG. 3 illustrates a cross-sectional view of the optical modulator 300, such that an optical carrier passes transversely through the profile of the optical modulator 200. Optical modulator 300 may comprise substantially similar characteristics to optical modulator 200. Optical modulator 300 comprises an upper slab 301 and a lower slab 305, which are substantially similar to upper slab 201 and a lower slab 205. Optical modulator 300 comprises a PN junction 310 that is substantially similar to PN junction 210 with an active depletion region. Upper slab 301 is illustrated with stippling and lower slab 305 is illustrated without stippling to indicate positive electron acceptor and negative electron donor regions, respectively. Shading between upper slab 301 and lower slab 305 indicates the depletion region extending through the center of the waveguide core (e.g.

through N2 113 and P2 112), but not into the rest of the optical mode. As such, FIGS. 2-3 show that PN junctions 210 and 310 (e.g. N2 113 and P2 112) overlap substantially all of the depletion region allowing for increased modulation efficiency, while maintaining lower doping outside of the depletion region as the areas outside the depletion region add to optical loss without significantly impacting modulation efficiency.

Figure 4:
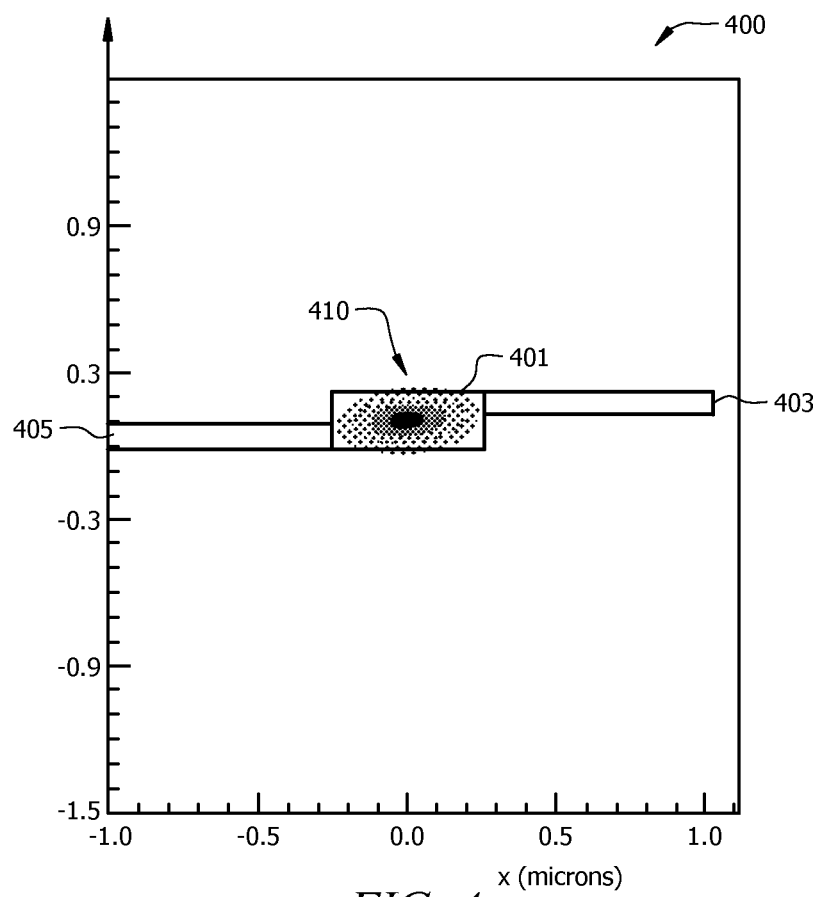
FIG. 4 is a schematic diagram of optical transmission through an embodiment of an optical modulator.

FIG. 4 is a schematic diagram of optical transmission through an embodiment of an optical modulator 400. FIG. 4 illustrates a cross-sectional view of the optical modulator 400, such that an optical carrier 410 passes transversely through the profile of the optical modulator 400. Optical modulator 400 may comprise substantially the same configuration as optical modulator 100, and may be a specific embodiment of optical modulator 100 as shown propagating an optical carrier 410. The optical carrier 410 may pass through a waveguide core 401, which may be substantially similar to waveguide core 118, and may be modulated by applying a voltage drop across a first coupling 403 and a second coupling 405, which may be substantially similar to P+ 121/P++ 123 and N+ 131/N++ 133, respectively. The optical carrier 410 is illustrating in stippling with stippling density corresponding to optical carrier 410 intensity. As shown in FIG. 4, the majority of the optical carrier 410 passes through the waveguide core 401 with a small amount of diffuse light passing through the undoped regions above/below the first coupling 403 and the second coupling 405. As such, maintaining the undoped regions supports reduced optical loss. Further, while the most intense portion of the optical carrier 410 passes through the center of the waveguide core 401 (e.g. through P2 112 and N2 113), a large portion of the light of the optical carrier 410 also passes around the center of the waveguide core 401 (e.g. through P1 111, and N1 114). As such, by maintaining a reduced doping profile adjacent to the depletion region of the vertical PN junction, a significant portion of the optical carrier 410 is exposed to a lower doped medium, resulting in lower optical loss without sacrificing modulation efficiency.

Figure 5:
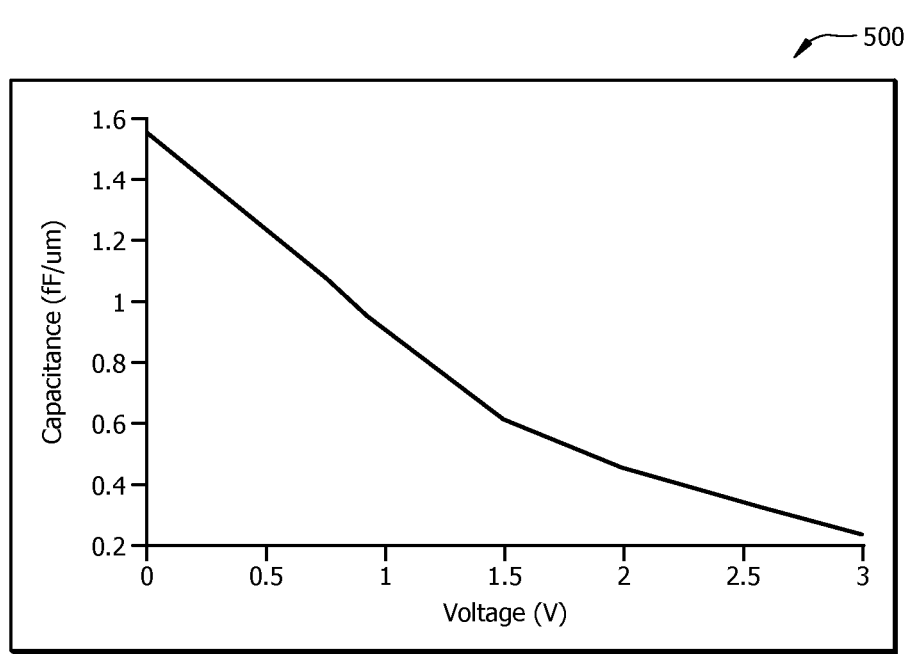
FIG. 5 is a graph of voltage versus capacitance across an embodiment of an optical modulator.

FIG. 5 is a graph 500 of voltage versus capacitance across an embodiment of an optical modulator, such as optical modulator 100. Voltage is shown in volts (v) and capacitance is shown in femtofarads (fF) per μm. As the optical modulator comprises semiconductive material, when no voltage is applied across the PN junction the optical modulator acts like a capacitor and as voltage is progressively applied the optical modulator passes current across the PN junction and acts more like a resistor. As shown in graph 500, a structure such as optical modulator 100 may be configured to progressively lose capacitance, and therefore change refractive index, by applying between zero and three volts across the PN junction, allowing the optical carrier to be selectively modulated based on the voltage applied.

Figure 6:
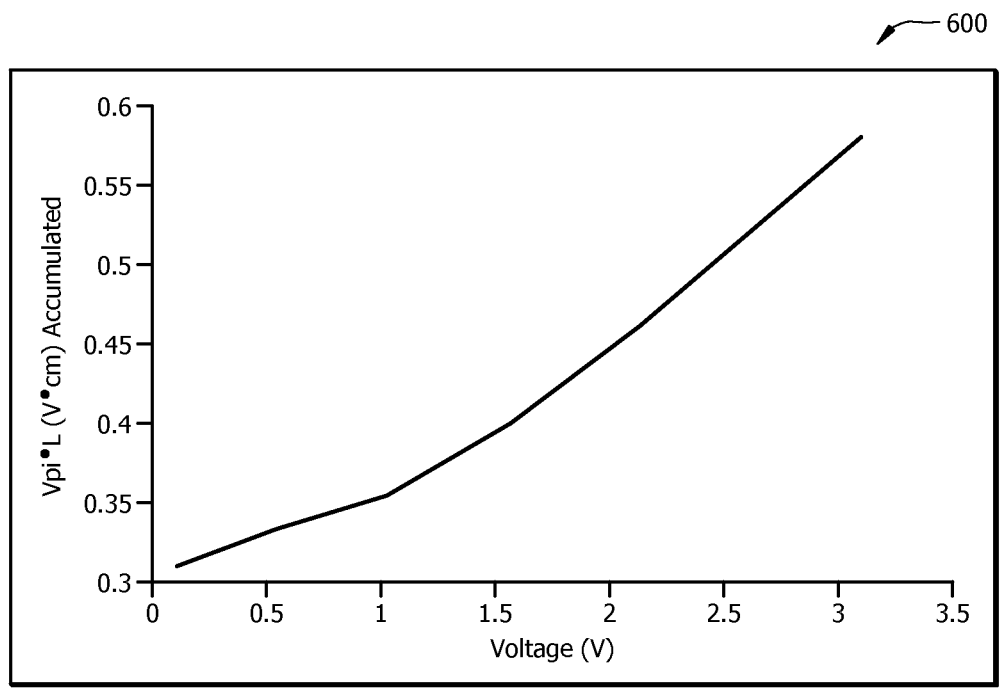
FIG. 6 is a graph of $\pi$ (Pi) phase shift voltage length (VpiL) for an embodiment of an optical modulator.

FIG. 6 is a graph 600 of Pi phase shift voltage length (VpiL) for an embodiment of an optical modulator, such as optical modulator 100. VpiL, also known as modulation efficiency, is the device voltage application length needed to cause a Pi phase shift in an optical carrier. VpiL is shown in volts per centimeter (cm). As more voltage is employed, a greater VpiL is needed to sufficiently affect the refractive index of the optical modulator in order to cause a Pi phase shift in the optical carrier. As such, the length of the optical modulator can be shorter if less voltage is employed, allowing for increased miniaturization. As shown, the optical modulator can employ a length of between about 0.3 cm to about 5.5 cm while causing a Pi shift in an optical carrier when employing between zero and three volts.

Figure 7:
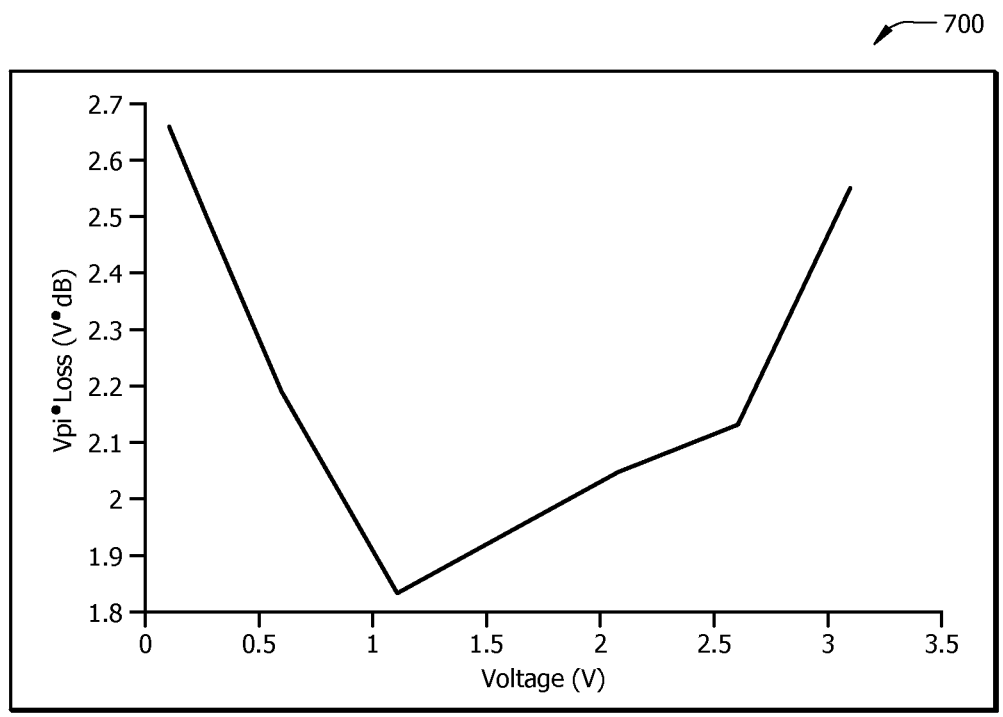
FIG. 7 is a graph of Pi phase shift voltage optical loss (VpiLoss) for an embodiment of an optical modulator.

FIG. 7 is a graph 700 of Pi phase shift voltage optical loss (VpiLoss) for an embodiment of an optical modulator, such as optical modulator 100. VpiLoss is the amount of optical loss that occurs when causing a phase shift of Pi in an optical carrier at a specified voltage. VpiLoss is shown in volts*decibel (dB). As shown in FIG. 7, the optical loss can range between 1.8 V*dB to 2.7 V*dB depending on the voltage employed. Further, by employing between about 0.5 V and about 2.5 V, the optical loss may be maintained below about 2.2 V*dB. The relatively low optical loss of the optical modulator is based in part on the low doping of areas around the depletion region of the PN junction in the waveguide core (e.g. P1 111, and N1 114).

Figure 8:
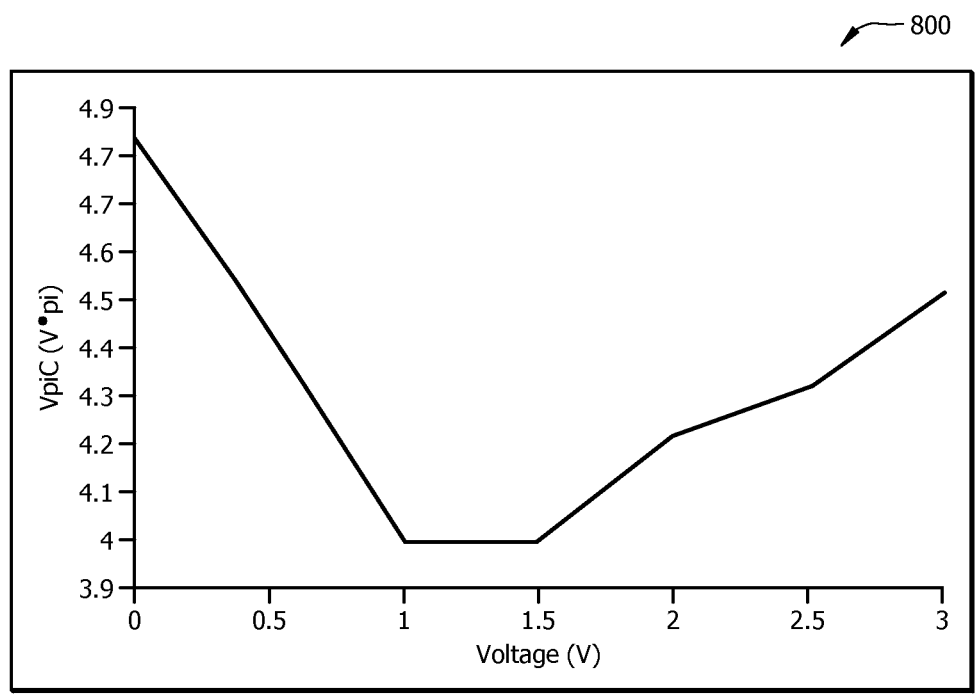
FIG. 8 is a graph of Pi phase shift voltage capacitance (VpiC) for an embodiment of an optical modulator.

FIG. 8 is a graph 800 of Pi phase shift voltage capacitance (VpiC) for an embodiment of an optical modulator, such as optical modulator 100. VpiC is the amount of capacitance that occurs when an optical carrier experiences a Pi phase shift at a specified voltage. VpiC is shown in V*picofarads (pf). As shown in FIG. 8, VpiC can be maintained below about 4.3 V*pf when the optical modulator is operating between about 0.5 volts and about 2.5 volts. The relatively low VpiC of the optical modulator is based in part on the heavier doping of the anode/cathode couplings (e.g. P+ 121, P++ 123, N+ 131, and N++ 133).

Figure 9:
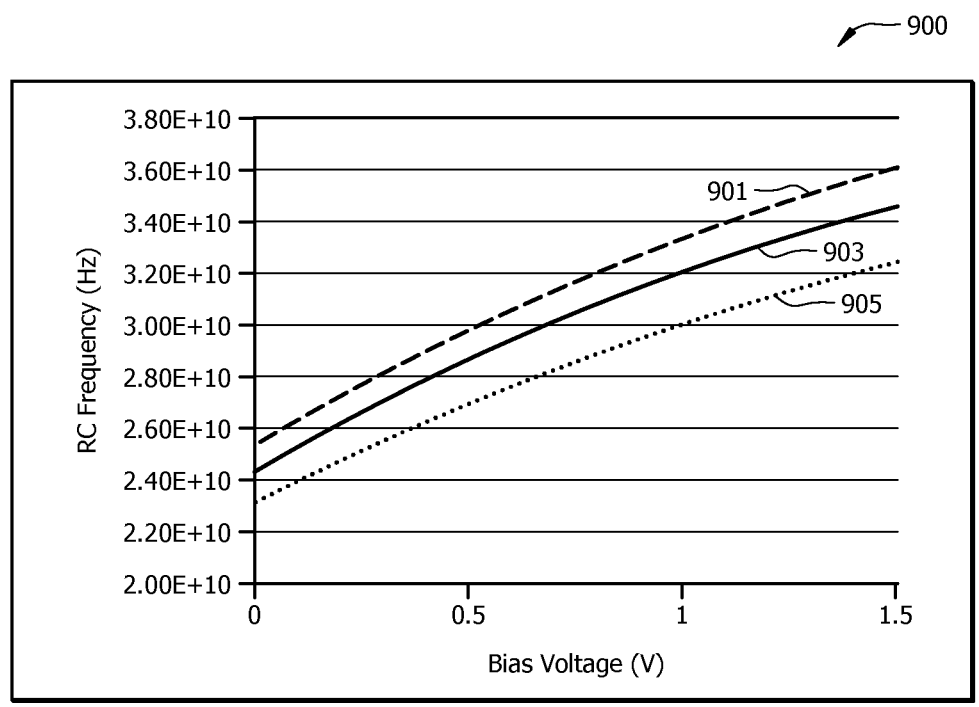
FIG. 9 is a graph of modulation speed for embodiments of an optical modulator.

FIG. 9 is a graph 900 of modulation speed for embodiments of an optical modulator, such as optical modulator 100 with various doping profiles. Graph 900 shows modulation speed of optical modulators 901, 903, and 905 in resistance (R) capacitance (C) frequency, in hertz (Hz), versus bias voltage. The RC response time influenced by the doping level in the electric path, (e.g. the doping of N1 114, P1 111, N+ 131, and P+ 121). Optical modulators 901, 903, and 905 vary based on doping level and are illustrated in dashed line, solid line, and dotted line, respectively, for purposes of clarity. The outer edge doping levels are $7e^{17}/cm^3$ for optical modulator 901, $5e^{17}/cm^3$ for optical modulator 903, and $2.5e^{17}$ cm$^3$ for optical modulator 905. As shown in FIG. 9, when voltage bias is maintained between about 0 V and about 1.5 V, the response can be maintained below $3.6^{10}$ Hz. As such, optical modulators 901, 903, and 905 may be employed for transmissions at 25 gigahertz (GHz). Higher doping of the depletion region (e.g. N2 113 and P2 112 is also optional to increase transmission speed. Further, lower doping and increased thickness of N1 114 and P1 111 may be employed to maintain a lower VpiLoss.

Figure 10:
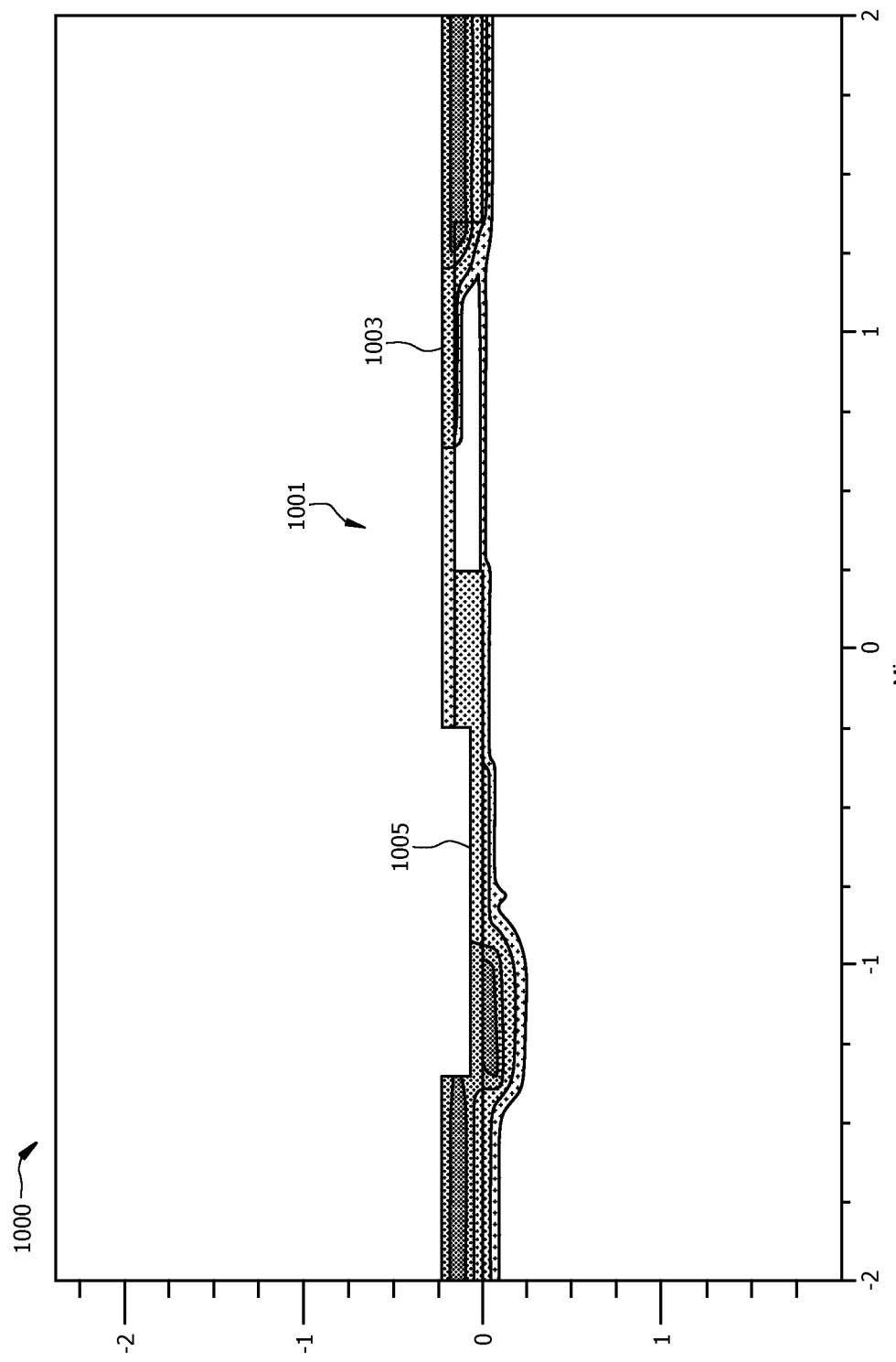
FIG. 10 illustrates a doping contour of an embodiment of an optical modulator.

FIG. 10 illustrates a doping contour 1000 of an embodiment of an optical modulator, such as optical modulator 100. FIG. 10 illustrates a cross-sectional view of the optical modulator 1001 in microns, such that an optical carrier passes transversely through the profile of the optical modulator 1001. The optical modulator 1001 comprises a waveguide core 401, which may be substantially similar to waveguide core 118, comprising a PN junction electrically coupled via a first coupling 1003 and a second coupling 1005, which may be substantially similar to P+ 121/P++ 123 and N+ 131/N++ 133, respectively. It should be noted that FIG. 10 is stretched in comparison to FIG. 1 to show varying levels of doping with greater clarity. Such varying levels of doping are illustrated with stippling of varying density. As shown in FIG. 10, the optical modulator 1001 comprises heavier doping toward the cathode and anode, with lighter doping toward the optical mode and a stripe of heavier doping at the center of the PN junction. While the embodiment of the optical modulator 1001 comprises Silicon dioxide ($SiO_2$), Silicon (Si), and/or Aluminum (Al), different or additional materials may also be employed. In the embodiment of FIG. 10, the optical modulator 1001 employed a growth thermal budget of 950 degrees Celsius (° C.) for five minutes.

Figure 11:
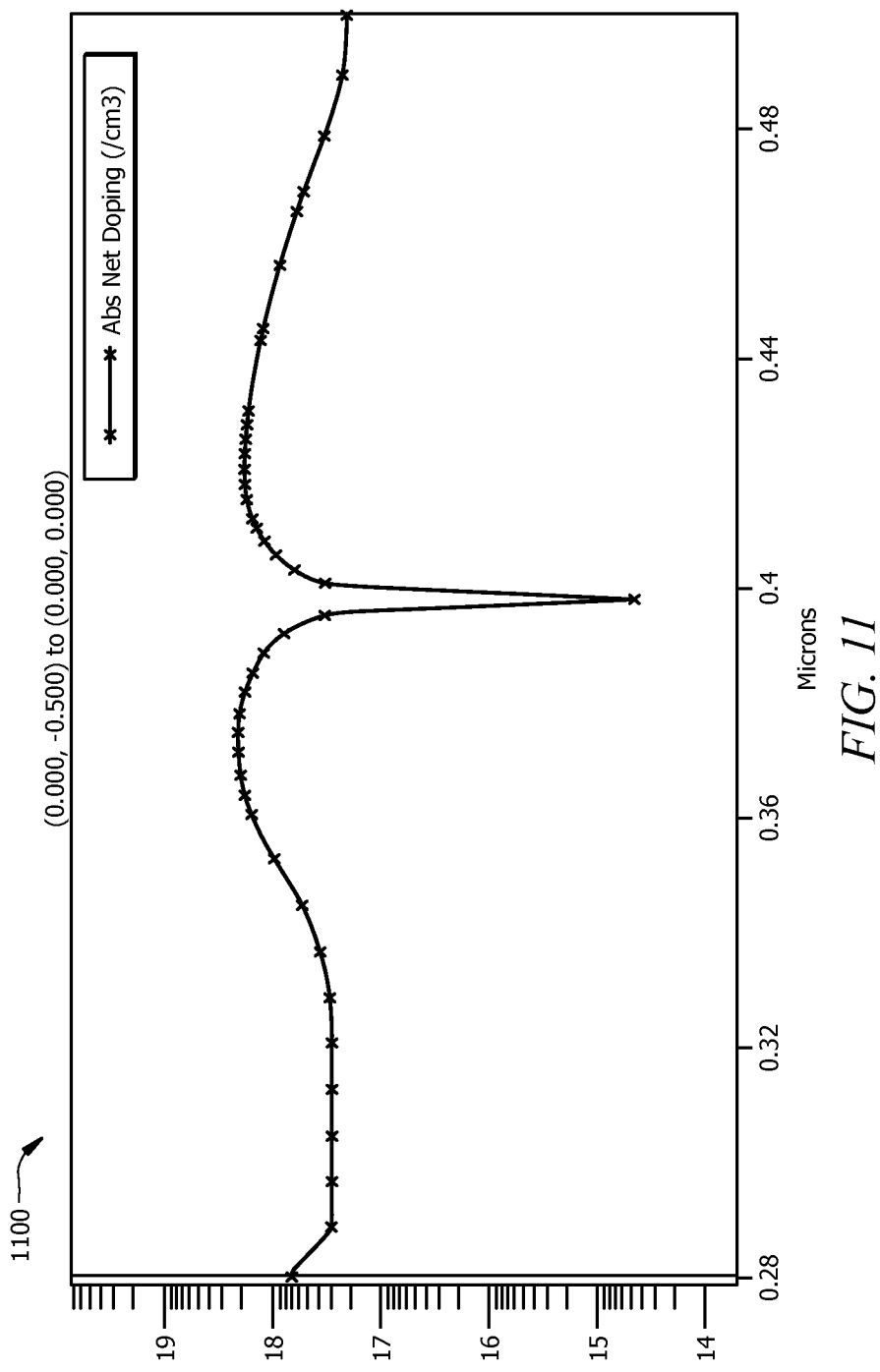
FIG. 11 illustrates a doping profile of an embodiment of PN junction in an optical modulator.

FIG. 11 illustrates a doping profile 1100 of an embodiment of a PN junction in an optical modulator, such as optical modulator 100. Doping profile 1100 is shown in absolute net doping in cm$^3$ per position in microns across the optical modulator (e.g. from left to right across optical modulator 100). As shown in FIG. 11, the PN junction employs an abrupt profile with a sharp drop in doping as seen in the portion of the graph near 0.4 microns. The sharp drop correspond to low doped areas P1 111 and N1 114.

Figure 12:
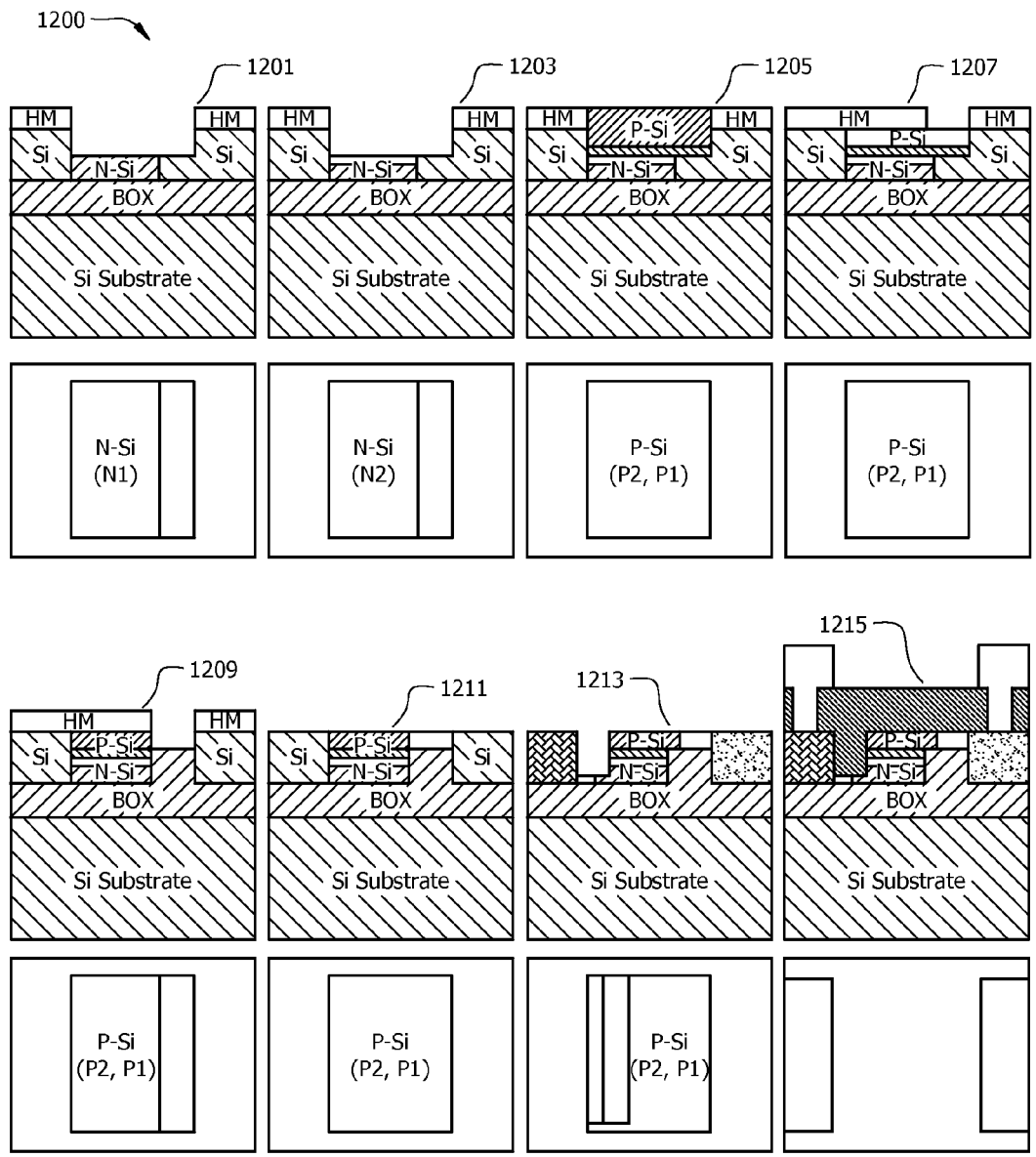
FIG. 12 illustrates a preparation process for an embodiment of an optical modulator.

FIG. 12 illustrates a preparation process 1200 for an embodiment of an optical modulator, such as optical modulator 100. FIG. 12 illustrates a cross-sectional view of the optical modulator in stages of preparation, such that an optical carrier passes transversely through the profile of the optical modulator. While the preparation process 1200 focuses on preparation of a silicon and/or silicon dioxide based optical modulator, many semiconductive materials with similar chemical properties may be employed, for example aluminum oxide, sapphire, germanium, gallium arsenide, indium phosphide, and alloys and/or combinations thereof. Manufacture by employing such materials is considered within the scope of the present disclosure. Further, regions in the optical modulator have been illustrated with shading to clarify prior to the preparation process 1200, a silicon base (e.g. wafer) is prepared. The base comprises a substrate for physically supporting the modulator, a working portion for creation of the modulator, and a box for separating the substrate from the working portion. Prior to the preparation process 1200, the base, working portion, and the box may comprise silicon, silicon dioxide, aluminum, etc. The box and the working portion may, for example, be grown on the substrate via epitaxial (Epi) growth. At step 1201, the base is covered with a hard mask (HM) to prevent etching, growth, doping, from affecting non-targeted areas of the base. The surface of the working portion not covered by HM is etched to create a recess. Such etching may employ wet etching, dry etching, local thermal oxidation, etc. The etched recess is negatively doped by surface doping to create an N1 region (e.g. N1 114). At step 1203, the etched recess is negatively doped by surface doping to create an N2 region (e.g. N2 113). At step 1205, a P2 region (e.g. P2 112) and a P1 region (e.g. P1 111) are created by in-situ growth, Epi growth, and/or chemical-mechanical planarization (CMP). At step 1207, any excess P1 region is removed along with the HM and a second HM is added for further fabrication. At step 1209, a portion of the P1 and P2 region is etched and filled with a dielectric material such, as silicon dioxide, to extend the box (e.g. undoped waveguide core edge 153). CMP may be employed as needed. At step 1211, silicon is added above the box via Epi/in-situ growth, the growth is polished via CMP, and the second HM is removed. At step 1213, a third HM is added and a portion of the P1, P2, N2, and N1 regions are etched. P+, P++, N+, and N++ doping is performed to create a P+ region, a P++ region, an N+ region, and an N++ region (e.g. P+ 121, P++ 123, N+ 131, and N++ 133, respectively). The third HM is then removed. At step 1215, the etched region is filled to create a dielectric region (e.g. waveguide core edge 151). Filling also creates an additional box above the PN junction to fill out the waveguide. An anode and cathode (e.g. anode 143 and cathode 141) are implanted via metallization.

Figure 13:
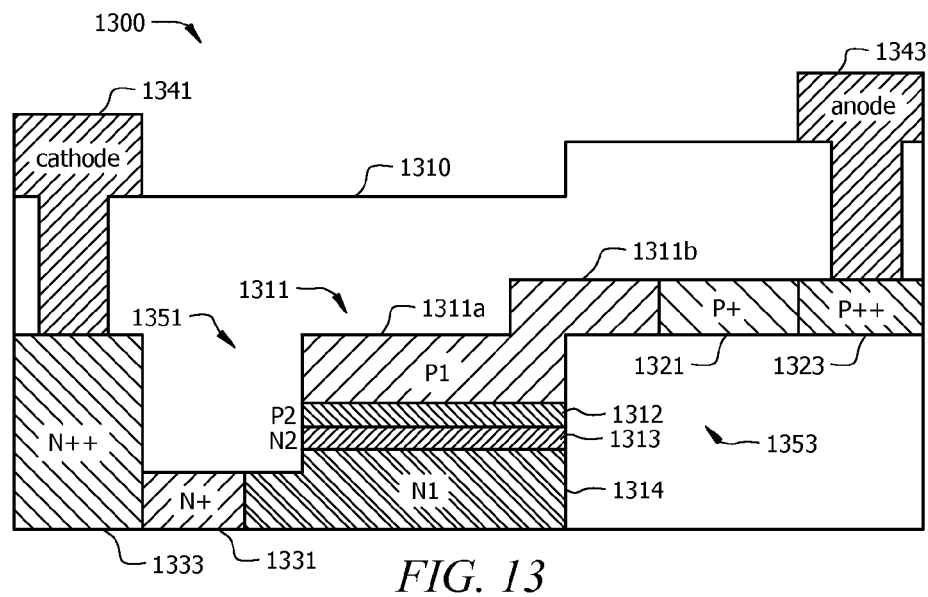
FIG. 13 is a schematic diagram of a second embodiment of an optical modulator with a vertical PN junction.

FIG. 13 is a schematic diagram of a second embodiment of an optical modulator 1300 with a vertical PN junction. FIG. 13 illustrates a cross-sectional view of the optical modulator 1300, such that an optical carrier passes transversely through the profile of the optical modulator 1300. FIG. 13 employs shading to clearly delineate between regions of the optical modulator 1300. Optical modulator 1300 comprises a waveguide 1310 comprising cathode 1341, negatively doped regions N++ 1333, N+ 1331, N1 1314, and N2 1313, positively doped regions P2 1312, P1 1311, P+ 1321, and P++ 1323, anode 1343, and waveguide core edges 1351 and 1353, which may be substantially similar to waveguide 110, cathode 141, N++ 133, N+ 131, N1 114, N2 113, P2 112, P1 111, P+ 121, P++ 123, anode 143, and waveguide core edges 151 and 153, respectively. P1 1311 differs from P1 111 in that P1 1311 comprises a lower portion 1311a and an upper portion 1311b that extends laterally from the lower portion 1311a as shown in FIG. 13. As such, lower portion 1311a and upper portion 1311b may be made from two separate slabs and created during separate steps of a manufacturing process. By extending upper portion 1311b above lower portion 1311a, P+ 1321 can be vertically offset in order to position P+ 1321 farther away from the waveguide core. As P+ 1321 comprises heavier doping, moving P+ 1321 away from the waveguide core may reduce optical loss at the potential cost to modulation efficiency and/or modulation frequency.

Figure 14:
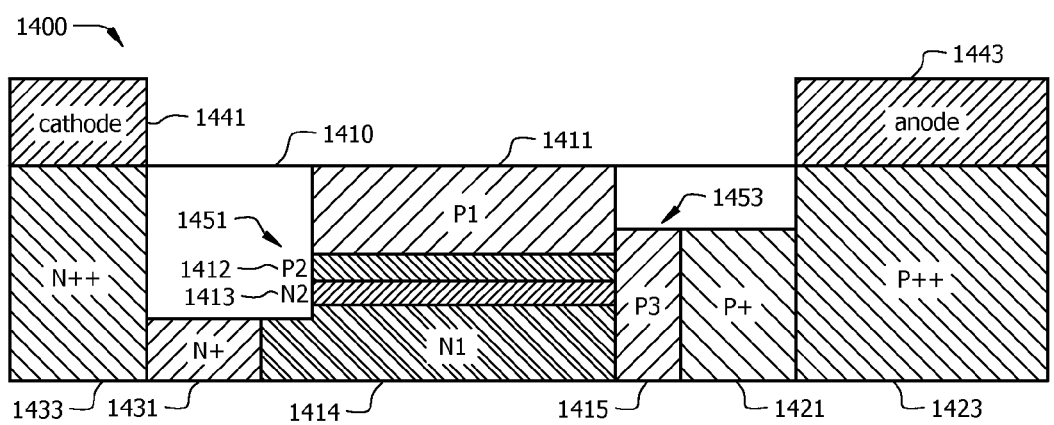
FIG. 14 is a schematic diagram of a third embodiment of an optical modulator with a vertical PN junction and a horizontal PN junction.

FIG. 14 is a schematic diagram of a third embodiment of an optical modulator 1400 with a vertical PN junction and a horizontal PN junction. FIG. 14 illustrates a cross-sectional view of the optical modulator 1400, such that an optical carrier passes transversely through the profile of the optical modulator 1400. FIG. 14 employs shading to clearly delineate between regions of the optical modulator 1400. Optical modulator 1400 comprises a waveguide 1410 comprising cathode 1441, negatively doped regions N++ 1433, N+ 1431, N1 1414, and N2 1413, positively doped regions P2 1412, P1 1411, P+ 1421, and P++ 1423, anode 1443, and waveguide core edges 1451 and 1453, which may be substantially similar to waveguide 110, cathode 141, N++ 133, N+ 131, N1 114, N2 113, P2 112, P1 111, P+ 121, P++ 123, anode 143, and waveguide core edges 151 and 153, respectively, but positioned in a different configuration. Specifically, P+ 1421 and P++ 1423 are doped to the bottom of the waveguide 1410, which allows P+ 1421 and P++ 1423 to be doped/grown during a common step with the negative regions. Doping P+ 1421 and P++ 1423 to the bottom of the waveguide may also allow for the omission of an etching step (e.g. used to create edge 153). Instead, edge 1453 is positioned above P+ 1421. Further, positively doped region (P3) 1415 is positioned in contact with P1 1411, P2 1412, N1 1414, N2 1413 and P+ 1421. Specifically, positioning P3 1415 between N1 1414 and P+ 1421, P3 1415 can serve the function of mitigating electrical capacitance between N1 1414 and P+ 1421. The presence of P3 1415 creates an additional side PN junction between P3 1415 and N1 1414 and N2 1413. The position of P3 1415 can be shifted as needed to place the side PN junction near the center of the waveguide core in order to maximize the overlap between the associated depletion region and the waveguide core/optical mode. Doping of P3 1415 may be performed by angled implantation. P3 1415 may heavily doped similarly to P2 1412, lightly doped similar to P1 1411, or doped at a level to transition between P2 1412 and P+ 1421 based on requirements for a specified application.

Figure 15:
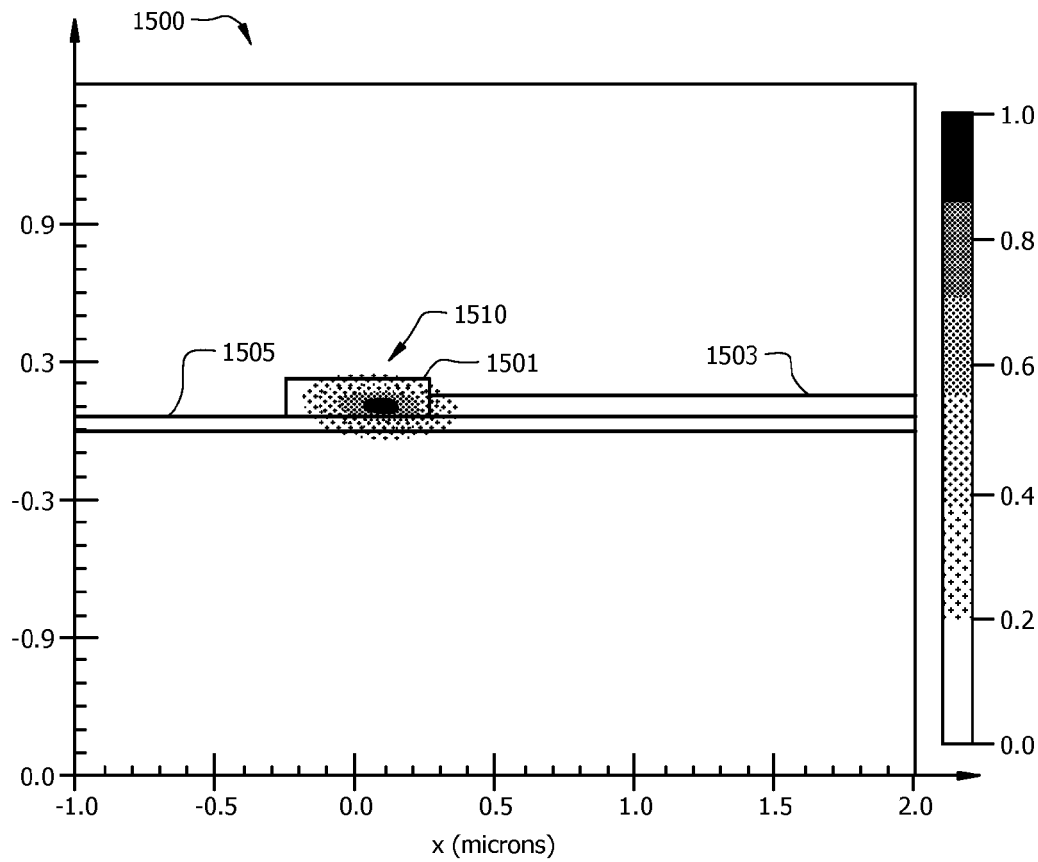
FIG. 15 is a schematic diagram of optical transmission through the third embodiment of the optical modulator.

FIG. 15 is a schematic diagram of optical transmission through the third embodiment of an optical modulator 1500. FIG. 15 illustrates a cross-sectional view of the optical modulator 1500, such that an optical carrier 1510 passes transversely through the profile of the optical modulator

1500. Optical modulator 1500 may comprise substantially the same configuration as optical modulator 1400, and may be a specific embodiment of optical modulator 1400 as shown propagating an optical carrier 1510. The optical carrier 1510 may pass through a waveguide core 1501, which may comprise P1 1411, P2 1412, and N2 1413. The waveguide core 1501 is modulated by applying a voltage drop across a first coupling slab 1503 and a second coupling slab 1505, which may comprise the P regions and the N regions, respectively, outside of the waveguide core 1501 of optical modulator 1400. The optical carrier 1510 is illustrated in stippling with stippling density corresponding to optical carrier 1510 intensity. As shown in FIG. 15, the most intense portion of the optical carrier 1510 passes through the center of the waveguide core 1501 in the area of the depletion regions of the vertical and horizontal PN junctions (e.g. P2 1412, N2 1413 and P3 1415). Further, a large portion of the light of the optical carrier 1510 also passes around the center of the waveguide core 1501 (e.g. through P1 1411, N1 1414, and edges 1451 and 1453). As such, by maintaining a reduced doping profile adjacent to the depletion regions of the PN junctions, a significant portion of the optical carrier 1510 is exposed to a lower doped medium, resulting in lower optical loss without sacrificing modulation efficiency.

Figure 16:
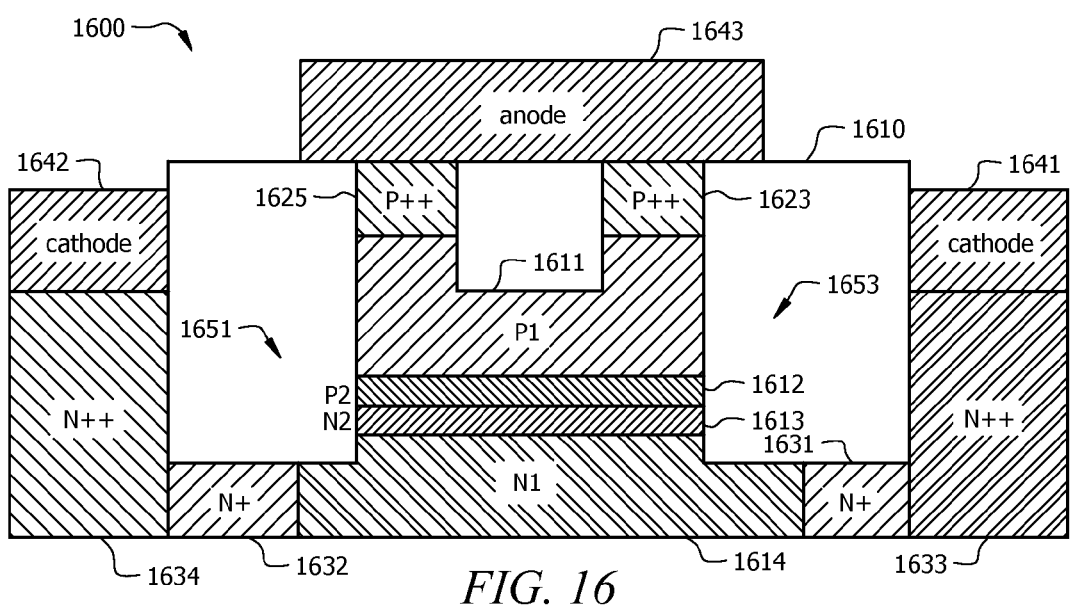
FIG. 16 is a schematic diagram of a fourth embodiment of an optical modulator with a vertical PN junction.

FIG. 16 is a schematic diagram of a fourth embodiment of an optical modulator 1600 with a vertical PN junction. FIG. 16 illustrates a cross-sectional view of the optical modulator 1600, such that an optical carrier passes transversely through the profile of the optical modulator 1600. FIG. 16 employs shading to clearly delineate between regions of the optical modulator 1600. Optical modulator 1600 comprises a waveguide 1610 comprising cathodes 1641 and 1642, negatively doped regions N++ 1633, N++ 1634, N+ 1631, N+ 1632, N1 1614, and N2 1613, positively doped regions P2 1612, P1 1611, P++ 1623, and P++ 1625, anode 1643, and waveguide core edges 1651 and 1653, which may be substantially similar to waveguide 110, cathode 141, N++ 133, N+ 131, N1 114, N2 113, P2 112, P1 111, P++ 123, anode 143, and waveguide core edges 151 and 153, respectively, but positioned in a different configuration. Specifically, optical modulator 1600 employs two cathodes 1641 and 1642 positioned on either end of the waveguide 1610 and coupled to the vertical PN junction via two N++ 1633 and 1634 regions and two N+ regions 1631 and 1632. The anode 1643 is positioned above the PN junction and coupled to the junction via two P++ regions 1623 and 1625. The P+ region is omitted. The P++ regions 1623 and 1625 create P++ poles that are vertically adjacent to P1 1611 and are separated by a dielectric portion of the waveguide 1610. The N+ regions 1632 and 1631 create N++ poles that are horizontally adjacent to N1 1614. The P++ poles and N++ poles are positioned outside of the waveguide core in order to have a minimized effect on optical loss of the optical carrier while reducing electrical resistance between the cathodes 1642 and 1641 and the anode 1643 across the PN junction due to an increased connection path area between the cathodes 1642 and 1641 and the anode 1643. The width of the P++ poles and N++ poles is selected to minimize effects of the increased doping of the poles on optical loss in the optical mode of the waveguide 1610.

Figure 17:
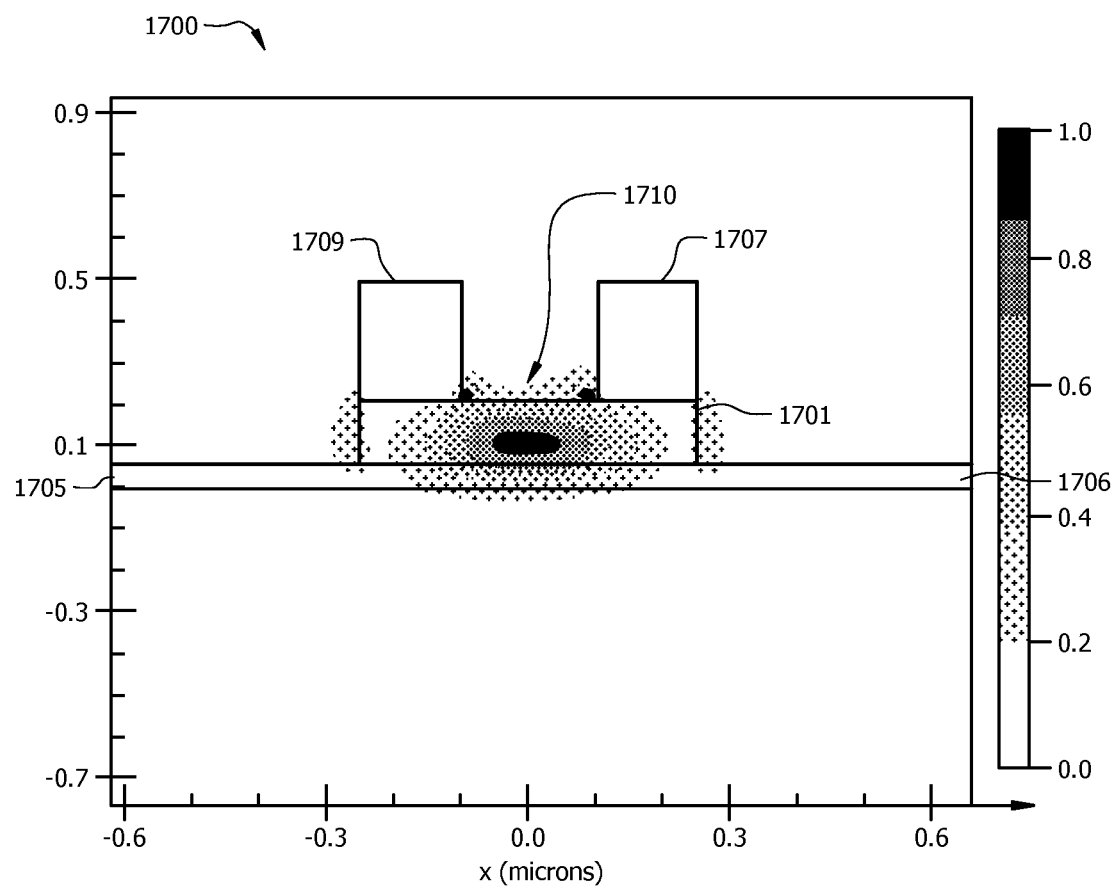
FIG. 17 is a schematic diagram of optical transmission through the fourth embodiment of the optical modulator.

FIG. 17 is a schematic diagram of optical transmission through the fourth embodiment of the optical modulator 1700. FIG. 17 illustrates a cross-sectional view of the optical modulator 1700, such that an optical carrier 1710 passes transversely through the profile of the optical modulator 1700. Optical modulator 1700 may comprise substantially the same configuration as optical modulator 1600, and may be a specific embodiment of optical modulator 1600 as shown propagating an optical carrier 1710. The optical carrier 1710 may pass through a waveguide core 1701, which may comprise a portion of P1 1611, P2 1612, N2 1613, and a portion of N1 1614. The waveguide core 1701 is modulated by applying a voltage drop across a first coupling 1705 (e.g. P++ 1625), a second coupling 1706 (e.g. P++ 1623), a third coupling 1707 (e.g. N+ 1631), and a fourth coupling 1709 (e.g. N+ 1632), which may be substantially similar to the horizontal and vertical poles of optical modulator 1600, respectively. The optical carrier 1710 is illustrated in stippling with stippling density corresponding to optical carrier 1710 intensity. As shown in FIG. 17, the most intense portion of the optical carrier 1710 passes through the center of the waveguide core 1701 in the area of the depletion regions of the vertical PN junction (e.g. P2 1612 and N2 1613). Further, a large portion of the light of the optical carrier 1710 also passes around the center of the waveguide core 1701 (e.g. through P1 1611, N1 1614, and edges 1651 and 1653). As such, by maintaining a reduced doping profile adjacent to the depletion region of the PN junction, a significant portion of the optical carrier 1710 is exposed to a lower doped medium, resulting in lower optical loss without sacrificing modulation efficiency.

Figure 18:
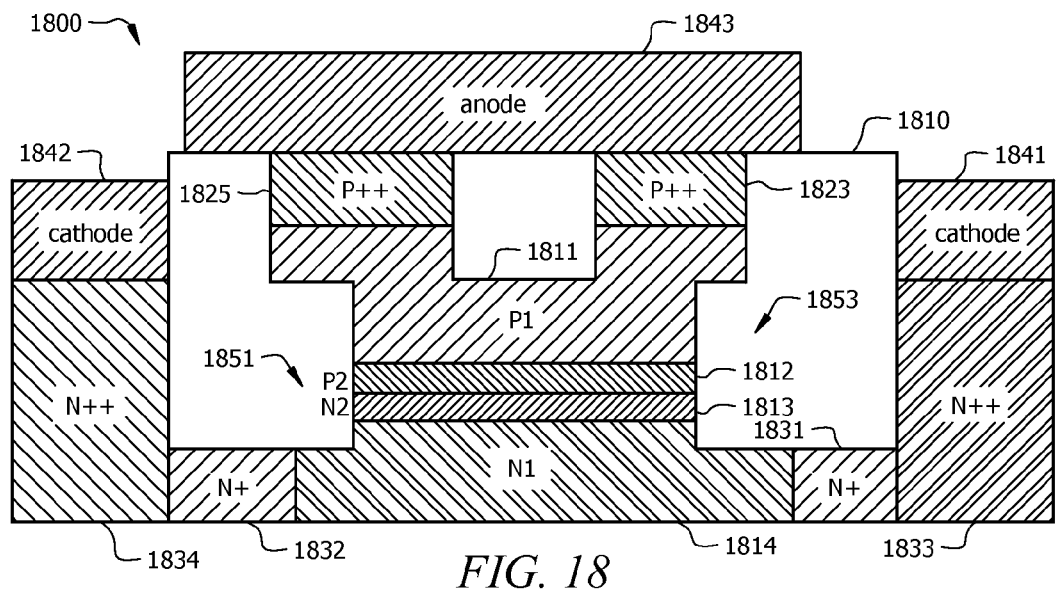
FIG. 18 is a schematic diagram of a fifth embodiment of an optical modulator with a vertical PN junction.

FIG. 18 is a schematic diagram of a fifth embodiment of an optical modulator 1800 with a vertical PN junction. FIG. 18 illustrates a cross-sectional view of the optical modulator 1800, such that an optical carrier passes transversely through the profile of the optical modulator 1800. FIG. 18 employs shading to clearly delineate between regions of the optical modulator 1800. Optical modulator 1800 comprises a waveguide 1810 comprising cathodes 1841 and 1842, negatively doped regions N++ 1833, N++ 1834, N+ 1831, N+ 1832, N1 1814, and N2 1813, positively doped regions P2 1812, P1 1811, P++ 1823, and P++ 1825, anode 1843, and waveguide core edges 1851 and 1853, which may be substantially similar to waveguide 1610, cathodes 1641 and 1642, N++ 1633, N++ 1634, N+ 1631, N+ 1632, N1 1614, N2 1613, P2 1612, P1 1611, P++ 1623, and P++ 1625, anode 1643, and waveguide core edges 1651 and 1653, respectively. In optical modulator 1800, the P++ poles formed by P++ 1825, P++ 1823, and P1 1811 are widened by expanding P++ 1825 and P++ 1823 horizontally. Vertical extensions of (e.g. poles) of P1 1811 are also expanded accordingly. As such, the poles of P1 1811 and/or P++ regions 1823 and 1825 can be seen as an upper slab separate from a slab comprising the lower portion of P1 1811. Accordingly, P1 1811 can be manufactured in multiple phases. Widening the P++ poles increases coupling area, which in turn reduces resistance and associated capacitive effects and increases modulation efficiency.

Figure 19:
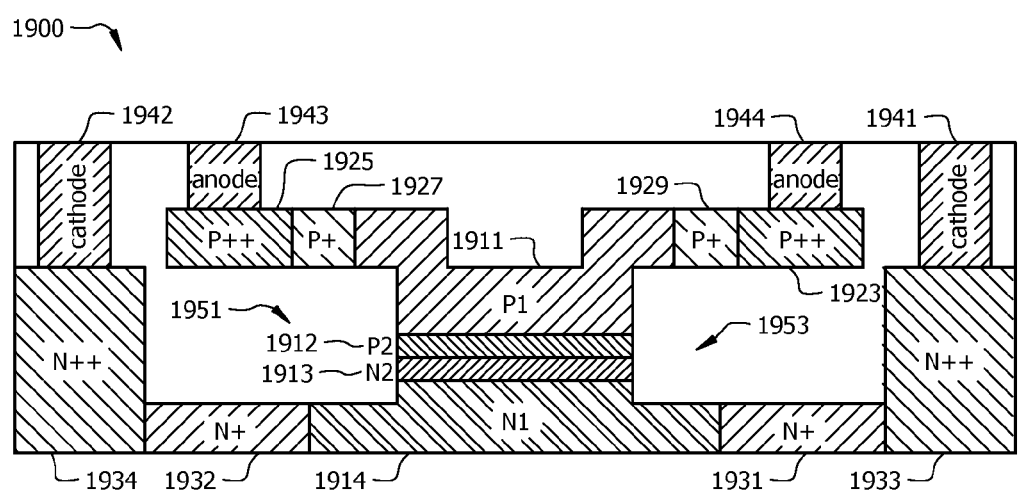
FIG. 19 is a schematic diagram of a sixth embodiment of an optical modulator with a vertical PN junction.

FIG. 19 is a schematic diagram of a sixth embodiment of an optical modulator 1900 with a vertical PN junction. FIG. 19 illustrates a cross-sectional view of the optical modulator 1900, such that an optical carrier passes transversely through the profile of the optical modulator 1900. FIG. 19 employs shading to clearly delineate between regions of the optical modulator 1900. Optical modulator 1900 comprises a waveguide comprising cathodes 1941 and 1942, negatively doped regions N++ 1933, N++ 1934, N+ 1931, N+ 1932, N1 1914, and N2 1913, positively doped regions P2 1912, P1 1911, P++ 1923, and P++ 1925, anodes 1943 and 1944, and waveguide core edges 1951 and 1953, which may be substantially similar to waveguide 1610, cathodes 1641 and 1642, N++ 1633, N++ 1634, N+ 1631, N+ 1632, N1 1614, N2 1613, P2 1612, P1 1611, P++ 1623, and P++ 1625, anode 1643, and waveguide core edges 1651 and 1653, respectively, but in a different configuration. P+ region 1927 is inserted between P++ 1925 and P1 1911 and P+ region 1929 is inserted between P++ 1923 and P1 1911. P+ 1927 and P+ 1929 may be substantially similar to P+ 121. P++ 1925 and P+ 1927 are positioned to form a first horizontal pole adjacent to P1 1911, and P++ 1923 and P+ 1929 are positioned to form a second horizontal pole adjacent to P1 1911. Anodes 1943 and 1944 couple to the PN junction via the horizontal poles. The horizontal poles have the effect of moving P++ 1923 and P++ 1925 farther from the waveguide core to reduce their effects on optical loss. The inclusion of P+ 1927 and P+ 1929 further support moving P++ 1923 and P++ 1925 farther from the waveguide core. Multiple poles are employed to mitigate resistance/capacitance and increase modulation speed/efficiency. The horizontal poles may be seen as a separate slab that can be manufactured in a pass separate from the lower portion of P1 1911.

Figure 20:
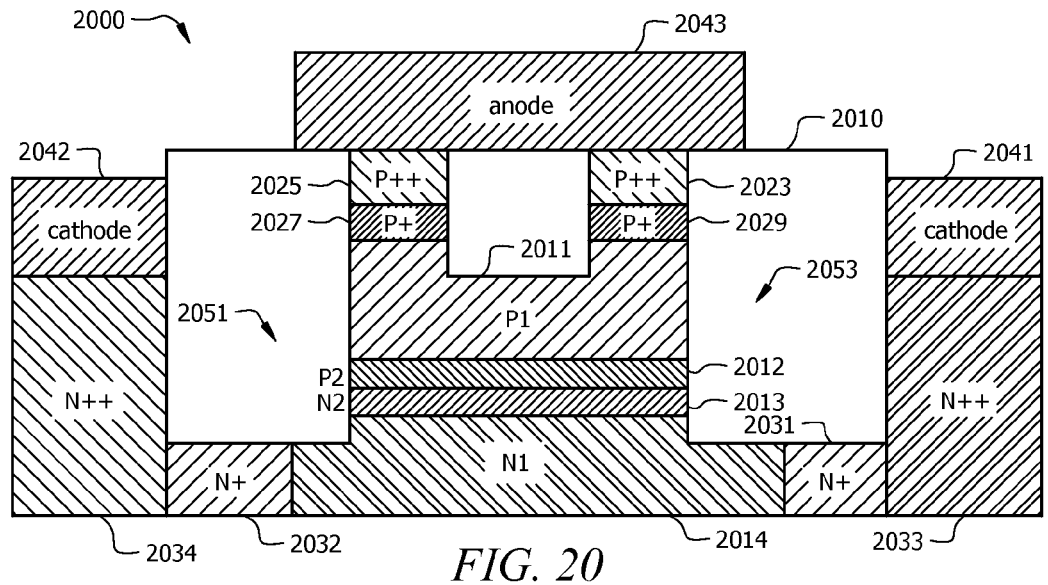
FIG. 20 is a schematic diagram of a seventh embodiment of an optical modulator with a vertical PN junction.

FIG. 20 is a schematic diagram of a seventh embodiment of an optical modulator 2000 with a vertical PN junction. FIG. 20 illustrates a cross-sectional view of the optical modulator 2000, such that an optical carrier passes transversely through the profile of the optical modulator 2000. FIG. 20 employs shading to clearly delineate between regions of the optical modulator 2000. Optical modulator 2000 comprises a waveguide 2010 comprising cathodes 2041 and 2042, negatively doped regions N++ 2033, N++ 2034, N+ 2031, N+ 2032, N1 2014, and N2 2013, positively doped regions P2 2012, P1 2011, P++ 2023, and P++ 2025, anode 2043, and waveguide core edges 2051 and 2053, which may be substantially similar to waveguide 1610, cathodes 1641 and 1642, negatively doped regions N++ 1633, N++ 1634, N+ 1631, N+ 1632, N1 1614, and N2 1613, positively doped regions P2 1612, P1 1611, P++ 1623, and P++1625, anode 1643, and waveguide core edges 1651 and 1653, respectively. Waveguide 2010 further comprises a positively doped region P+ 2027, positioned between P1 2011 and P++ 2025, and a positively doped region P+ 2029, positioned between P1 2011 and P++ 2023, as part of the P++ poles as discussed with respect to FIG. 16. P+ 2027 and 2029 may each be substantially similar to P+ 121. P+ 2027 and 2029 comprise less positive doping than P++ 2023 and 2025 and more positive doping that P1 2011. Accordingly, P+ 2027 and 2029 provide reduced electrical resistance at the edge of the waveguide core to promote lower electrical resistance resulting in greater modulation efficiency, while mitigating peripheral optical loss associated with P++ 2023 and P++ 2025.

Figure 21:
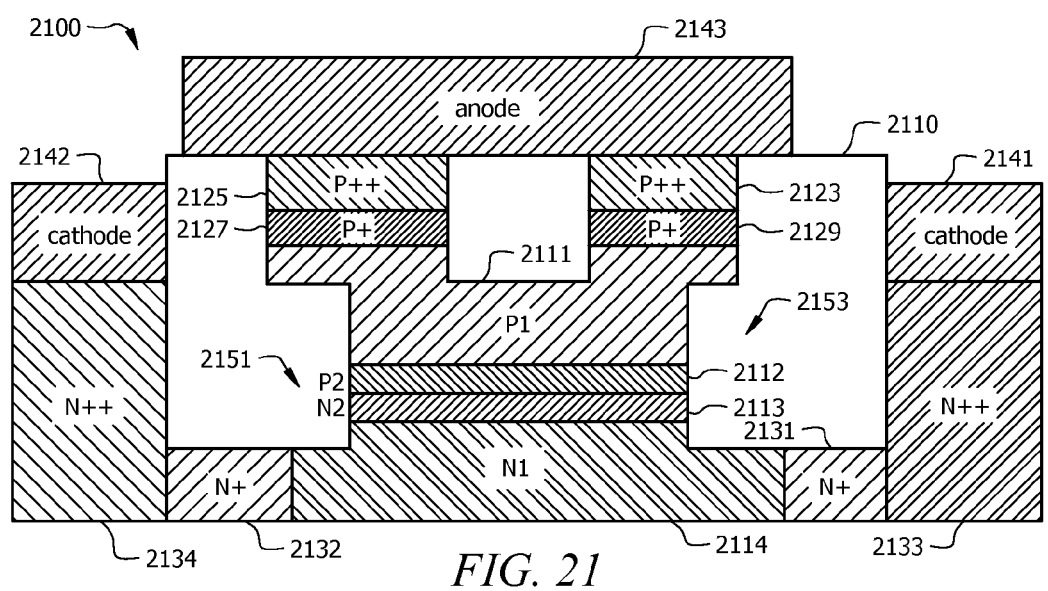
FIG. 21 is a schematic diagram of an eighth embodiment of an optical modulator with a vertical PN junction.

FIG. 21 is a schematic diagram of an eighth embodiment of an optical modulator 2100 with a vertical PN junction. FIG. 21 illustrates a cross-sectional view of the optical modulator 2100, such that an optical carrier passes transversely through the profile of the optical modulator 2100. FIG. 21 employs shading to clearly delineate between regions of the optical modulator 2100. Optical modulator 2100 comprises a waveguide 2110 comprising cathodes 2141 and 2142, negatively doped regions N++ 2133, N++ 2134, N+ 2131, N+ 2132, N1 2114, and N2 2113, positively doped regions P2 2112, P1 2111, P++ 2123, and P++ 2125, anode 2143, and waveguide core edges 2151 and 2153, which may be substantially similar to waveguide 1810, cathodes 1841 and 1842, negatively doped regions N++ 1833, N++ 1834, N+ 1831, N+ 1832, N1 1814, and N2 1813, positively doped regions P2 1812, P1 1811, P++ 1823, and P++1825, anode 1843, and waveguide core edges 1851 and 1853, respectively. Waveguide 2110 further comprises a positively doped region P+ 2127, positioned between P1 2111 and P++ 2125, and a positively doped region P+ 2129, positioned between P1 2111 and P++ 2123, as part of the P++ poles as discussed with respect to FIGS. 16 and 18. P+ 2127 and 2129 may each be substantially similar to P+ 121. P+ 2127 and 2129 comprise less positive doping than P++ 2123 and 2125 and more positive doping that P1 2111. Accordingly, P+ 2127 and 2129 provide reduced electrical resistance at the edge of the waveguide core to promote lower electrical resistance resulting in greater modulation efficiency, while mitigating peripheral optical loss associated with P++ 2123 and P++ 2125.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. An optical modulator comprising:
   a silicon waveguide comprising a waveguide core that comprises:
      a first positively doped (P1) region vertically adjacent to a second positively doped (P2) region such that the P2 region is more heavily positively doped than the P1 region; and
      a first negatively doped (N1) region vertically adjacent to a second negatively doped (N2) region such that the N2 region is more heavily negatively doped than the N1 region, wherein the N2 region and the P2 region are positioned vertically adjacent to form a positive-negative (PN) junction;
   at least one cathode; and
   at least one anode selectively electrically coupled to the cathode across the waveguide core via the PN junction such that a voltage drop applied between the cathode and the anode modulates an optical carrier passing through the PN junction by changing a refractive index of the waveguide core,
   wherein the P2 region is smaller than the P1 region and the N2 region is smaller than the N1 region such that the P2 and N2 regions have a greater effect on the refractive index change than the P1 and N1 regions, and such that the P1 and N1 regions have a lesser effect on optical loss of the optical carrier than the P2 and N2 regions, and
   wherein the P1 region extends laterally without progressing to the anode and the N1 region extends laterally without processing to the cathode.

2. The optical modulator of claim 1, wherein the P2 region comprises a thickness selected such that the P2 region is completely depleted of positive ions when the voltage drop is applied between the cathode and the anode.

3. The optical modulator of claim 2, wherein the N2 region comprises a thickness selected such that the N2 region is completely depleted of negative ions when the voltage drop is applied between the cathode and the anode.

4. The optical modulator of claim 1, wherein the P2 region is formed by in-situ doped growth.

5. The optical modulator of claim 1, wherein the N2 region is formed by in-situ doped growth.

6. The optical modulator of claim 1, wherein the P2 region is formed by surface doping.

7. The optical modulator of claim 1, wherein the N2 region is formed by surface doping.

8. The optical modulator of claim 1, wherein the waveguide further comprises:
 a third positively doped (P+) region horizontally adjacent to the P1 region such that the P+ region is more heavily positively doped than the P1 region; and
 a third negatively doped (N+) region horizontally adjacent to the N1 region such that the N+ region is more heavily negatively doped than the N1 region,
 wherein the P+ region and the N+ region are positioned outside of the waveguide core such that the P+ region and N+ region have a minimized effect on the optical loss of the optical carrier with respect to the N1 region, the N2 region, the P1 region, and the P2 region and such that the P+ region and the N+ region reduce electrical resistance between the cathode and the anode with respect to the N1 region, the N2 region, the P1 region, and the P2 region.

9. The optical modulator of claim 8, wherein the waveguide further comprises a fourth positively doped (P3) region positioned between the P1 region and the P+ region and positioned between the N1 region and the P+ region such that the P3 region and the N1 region create a horizontal PN junction.

10. The optical modulator of claim 1, wherein the waveguide further comprises:
 a plurality of positively doped (P++) poles vertically adjacent to the P1 region such that the P++ poles are more heavily positively doped than the P1 region, wherein the P++ poles are separated by a dielectric portion of the waveguide; and
 a plurality of negatively doped (N++) regions horizontally adjacent to the N1 region such that the N++ regions are more heavily negatively doped than the N1 region and such that the N++ regions are separated by the N1 region,
 wherein the P++ poles and the N++ regions are positioned outside of the waveguide core such that the P++ poles and the N++ regions have a minimized effect on the optical loss of the optical carrier with respect to the N1 region, the N2 region, the P1 region, and the P2 region and such that the P++ poles and the N++ regions reduce electrical resistance between the cathode and the anode with respect to the N1 region, the N2 region, the P1 region, and the P2 region,
 wherein the anode is vertically adjacent and directly coupled to the P++ poles, and
 wherein the at least one cathode comprises a cathode directly coupled to each N++ region.

11. The optical modulator of claim 10, wherein the waveguide further comprises a plurality of positively doped (P+) regions, each P+ region positioned between one of the P++ poles and the P1 region such that the P+ regions are less heavily positively doped than the P++ poles and more heavily positively doped than the P1 region.

12. The optical modulator of claim 10, wherein the waveguide further comprises a plurality of negatively doped (N+) regions, each N+ region positioned between one of the N++ regions and the N1 region such that the N+ regions are less heavily positively doped than the N++ regions and more heavily positively doped than the N1 region.

13. The optical modulator of claim 1, wherein the waveguide further comprises:
 a plurality of positively doped (P++) poles horizontally adjacent to the P1 region such that the P++ poles are more heavily positively doped than the P1 region, wherein the P++ poles are separated by the P1 region; and
 a plurality of negatively doped (N++) regions horizontally adjacent to the N1 region such that the N++ regions are more heavily negatively doped than the N1 region and such that the N++ regions are separated by the N1 region,
 wherein the at least one anode comprises an anode coupled to each P++ pole,
 wherein the at least one cathode comprises a cathode coupled to each N++ region, and
 wherein the P++ poles and the N++ regions are positioned outside of the waveguide core such that the P++ poles and the N++ regions have a minimized effect on the optical loss of the optical carrier with respect to the N1 region, the N2 region, the P1 region, and the P2 region and such that the P++ poles and the N++ regions reduce electrical resistance between the cathodes and the anodes with respect to the N1 region, the N2 region, the P1 region, and the P2 region.

14. The optical modulator of claim 13, wherein the waveguide further comprises a plurality of positively doped (P+) regions, each P+ region positioned between one of the P++ poles and the P1 region such that the P+ regions are less heavily positively doped than the P++ poles and more heavily positively doped than the P1 region.

15. The optical modulator of claim 13, wherein the waveguide further comprises a plurality of negatively doped (N+) poles, each N+ pole positioned between one of the N++ regions and the N1 region such that the N+ poles are less heavily positively doped than the N++ regions and more heavily positively doped than the N1 region.

16. An optical modulator prepared by a process comprising:
 doping a first negatively doped (N1) region of a silicon wafer to create a vertically adjacent second negatively doped (N2) region such that the N2 region is more heavily negatively doped than the N1 region; and
 doping a first positively doped (P1) region and a vertically adjacent second positively doped (P2) region vertically adjacent to the N2 region such that the P2 region is more heavily positively doped than the P1 region and such that the P2 region and the N2 region form a depletion region of a vertical positive-negative (PN) junction, and
 wherein the P1 region extends laterally without progressing to an anode and the N1 region extends laterally without progressing to a cathode.

17. The optical modulator of claim 16, wherein the N1 region, N2 region, P1 region, and P2 region are positioned in a center of a waveguide core, and wherein the process further comprises:
 etching horizontal edges of the waveguide core surrounding the center of the waveguide core; and filling the etched horizontal edges of the waveguide core with silicon dioxide (SiO$_2$).

18. The optical modulator of claim 17, wherein the process further comprises:
adding a silicon layer vertically adjacent to at least one of the etched horizontal edges; and
doping the silicon layer to support electrical connectivity to the PN junction.

19. The optical modulator of claim 18, wherein the process further comprises implanting the cathode and the anode in the silicon wafer such that the cathode is in electrical communication with the vertical PN junction via a first electrical connection arm and the anode is in electrical communication with the vertical PN junction via a second electrical connection arm.

20. The optical modulator of claim 19, wherein the P2 region and the N2 region are sized to support complete depletion of the P2 region and the N2 region of ions when a voltage is applied across the PN junction via the cathode and the anode.

21. A method for preparing an optical modulator, the method comprising:
doping a first negatively doped (N1) region of a silicon wafer to create a vertically adjacent second negatively doped (N2) region such that the N2 region is more heavily negatively doped than the N1 region; and
doping a first positively doped (P1) region and a vertically adjacent second positively doped (P2) region vertically adjacent to the N2 region such that the P2 region is more heavily positively doped than the P1 region and such that the P2 region and the N2 region form a depletion region of a vertical positive-negative (PN) junction,
wherein the P1 region extends laterally without progressing to an anode and the N1 region extends laterally without progressing to a cathode.

22. The method of claim 21, wherein the N1 region, N2 region, P1 region, and P2 region are positioned in a center of a waveguide core, and wherein the process further comprises:
etching horizontal edges of the waveguide core surrounding the center of the waveguide core; and
filling the etched horizontal edges of the waveguide core with silicon dioxide (SiO$_2$).

23. The method of claim 22, wherein the process further comprises:
adding a silicon layer vertically adjacent to at least one of the etched horizontal edges; and
doping the silicon layer to support electrical connectivity to the PN junction.

24. The method of claim 23, wherein the process further comprises implanting the cathode and the anode in the silicon wafer such that the cathode is in electrical communication with the vertical PN junction via a first electrical connection arm and the anode is in electrical communication with the vertical PN junction via a second electrical connection arm.

25. The method of claim 24, wherein the P2 region and the N2 region are sized to support complete depletion of the P2 region and the N2 region of ions when a voltage is applied across the PN junction via the cathode and the anode.

* * * * *